United States Patent
Luo et al.

(10) Patent No.: US 7,144,824 B2
(45) Date of Patent: Dec. 5, 2006

(54) METHOD FOR CONTROLLING THE PROPERTIES OF DARC AND MANUFACTURING DARC

(75) Inventors: Shing-Ann Luo, Hsinchu (TW); Chien-Hung Lu, Hsinchu (TW); Chin-Ta Su, Hsinchu (TW)

(73) Assignee: Macronix International Co. Ltd., Hsinchu (TW)

( * ) Notice: Subject to any disclaimer, the term of this patent is extended or adjusted under 35 U.S.C. 154(b) by 70 days.

(21) Appl. No.: 11/002,940

(22) Filed: Dec. 1, 2004

(65) Prior Publication Data

US 2006/0115991 A1 Jun. 1, 2006

(51) Int. Cl.
*H01L 21/31* (2006.01)
*H01L 21/469* (2006.01)

(52) U.S. Cl. ...................... 438/758; 438/784
(58) Field of Classification Search ............... 438/758, 438/761, 769, 784, 786
See application file for complete search history.

(56) References Cited

U.S. PATENT DOCUMENTS 6,218,314 B1 * 4/2001 Lin ........................ 438/761
6,566,186 B1 * 5/2003 Allman et al. ............ 438/239
6,924,191 B1 * 8/2005 Liu et al. ................. 438/241

* cited by examiner

*Primary Examiner*—Phuc T. Dang
(74) *Attorney, Agent, or Firm*—J.C. Patents

(57) ABSTRACT

A method for controlling the properties of a dielectric anti-reflective coating (DARC) is provided. In the process of forming the DARC, a nitrogen-containing gas is added to a reaction gas comprising silicon-containing gas and oxygen for controlling the n value of the DARC. Furthermore, the proportion of the silicon-containing gas to the oxygen or the proportion of the silicon-containing gas to the nitrogen-containing gas is increased to control the k value of the DARC. By means of proper control of the n value and the k value, the DARC can have the lowest substrate reflectivity.

14 Claims, 1 Drawing Sheet

METHOD FOR CONTROLLING THE PROPERTIES OF DARC AND MANUFACTURING DARC

BACKGROUND OF THE INVENTION

1. Field of the Invention

The present invention relates to a method for manufacturing an anti-reflective coating. More particularly, the present invention relates to a method for controlling the properties of a dielectric anti-reflective coating (DARC) and manufacturing DARC.

2. Description of the Related Art

With the ever-decreasing size of feature line widths in semiconductor manufacturing, photolithographic process is carried out with increasing difficulties. As the line width is decreased, misalignment occurs with increasing frequency especially in the process of defining a conductive layer. Because the reflectivity index of the conductive layer is normally higher than the surrounding dielectric layer or insulation layer, light can easily reflect from the surface of the conductive layer during the definition of a photoresist pattern and lead to a change in dimension. Ultimately, the transferred pattern after the photolithographic process can be highly inaccurate. To prevent such dimensional deviation, an anti-reflective coating (ARC) is normally deposited over the conductive layer for reducing reflectivity.

Most anti-reflective coating can be classified into "bottom ARC" and "top ARC" according to whether the anti-reflective coating is formed over or under the photoresist layer. The anti-reflective coating can be fabricated using an organic material or an inorganic material. Typically, organic material layer such as polymer is deposited over the photoresist layer after it is formed. On the other hand, inorganic material such as titanium nitride (TiN), silicon dioxide ($SiO_2$) or silicon oxynitride (SiON) is deposited over the conductive layer before forming the photoresist layer.

The anti-reflective coating is normally formed by carrying out a chemical vapor deposition process. For example, if the dielectric material constituting the anti-reflective coating is silicon dioxide, reactive gases such as silane ($SiH_4$) and oxygen ($O_2$) or tetra-ethyl-ortho-silicate (TEOS) can be employed. On the other hand, if the dielectric material constituting the anti-reflective coating is silicon oxynitride ($SiO_xN_y$), a plasma-enhanced chemical vapor deposition process is carried out using silane, nitrous oxide ($N_2O$), ammonia ($NH_3$) and nitrogen ($N_2$) as the reactive gases.

However, if the step height of the device patterns on a semiconductor substrate is too large, the anti-reflective coating at different height levels will have a different reflectivity. In some cases, the difference in reflectivity may result in errors during the photolithographic process.

SUMMARY OF THE INVENTION

Accordingly, at least one objective of the present invention is to provide a method for controlling the properties of a dielectric anti-reflective coating (DARC) so that the difference in reflectivity of the DARC covering the pattern at different height levels is reduced.

At least a second objective of the present invention is to provide a method for manufacturing a dielectric anti-reflective coating (DARC) that can set the n value and k value of the DARC and minimize reflectivity.

To achieve these and other advantages and in accordance with the purpose of the invention, as embodied and broadly described herein, the invention provides a method for controlling the properties of a dielectric anti-reflective coating. The method is to react a silicon-containing gas with oxygen for forming a dielectric anti-reflective coating. One major aspect of the method is that a nitrogen-containing gas is added to the silicon-containing gas and the oxygen when forming the DARC. The gas flow ratio of the nitrogen-containing gas to the silicon-containing gas and oxygen is about 0.01~10 for controlling the n value of the DARC. Furthermore, the proportion of the silicon-containing gas to the oxygen or the proportion of the silicon-containing gas to the nitrogen-containing gas can be increased to control the k value of the DARC.

According to the aforementioned method for controlling the properties of the DARC, the DARC comprises a silicon oxynitride layer, the silicon-containing gas comprises silane and the nitrogen-containing gas comprises nitrous oxide or ammonia. In one embodiment, the gas flow ratio between the silicon-containing gas and the oxygen is about 1~1.5 and the gas flow rate of the nitrogen-containing gas is about 75~300 sccm when the DARC has an n-value of 1.7 and a k value of 0.6. In another embodiment, the gas flow rate of the nitrogen-containing gas is about 95 sccm and the gas flow ratio of the silicon-containing gas to the nitrogen-containing gas is about 1~1.5.

The present invention also provides a method for manufacturing a dielectric anti-reflective coating (DARC) such the DARC has a predetermined n value and a predetermined k value. The method comprises providing a silicon-containing gas and oxygen. Thereafter, a nitrogen-containing gas is added to the silicon-containing gas and the oxygen. The gas flow ratio of the nitrogen-containing gas to the silicon-containing gas and oxygen is about 0.01~10 for getting the predetermined n value of the DARC. In the meantime, the proportion of the silicon-containing gas to the oxygen or the proportion of the silicon-containing gas to the nitrogen-containing gas is increased to get the predetermined k value of the DARC. Finally, the silicon-containing gas, the oxygen and the nitrogen-containing gas having the aforementioned gas flow ratios and proportions are used to carry out a chemical vapor deposition process.

In the present invention, nitrogen-containing gas is added to a gaseous mixture comprising silicon-containing gas and oxygen to control the n value of the DARC. Furthermore, the proportion of silicon-containing gas to the oxygen or the proportion of the silicon-containing gas to the nitrogen-containing gas is increased to control the k value of the DARC. Thus, the DARC can have the lowest possible substrate reflectivity and reduce the difference in reflection from the surface of the DARC covered pattern located at different height levels.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
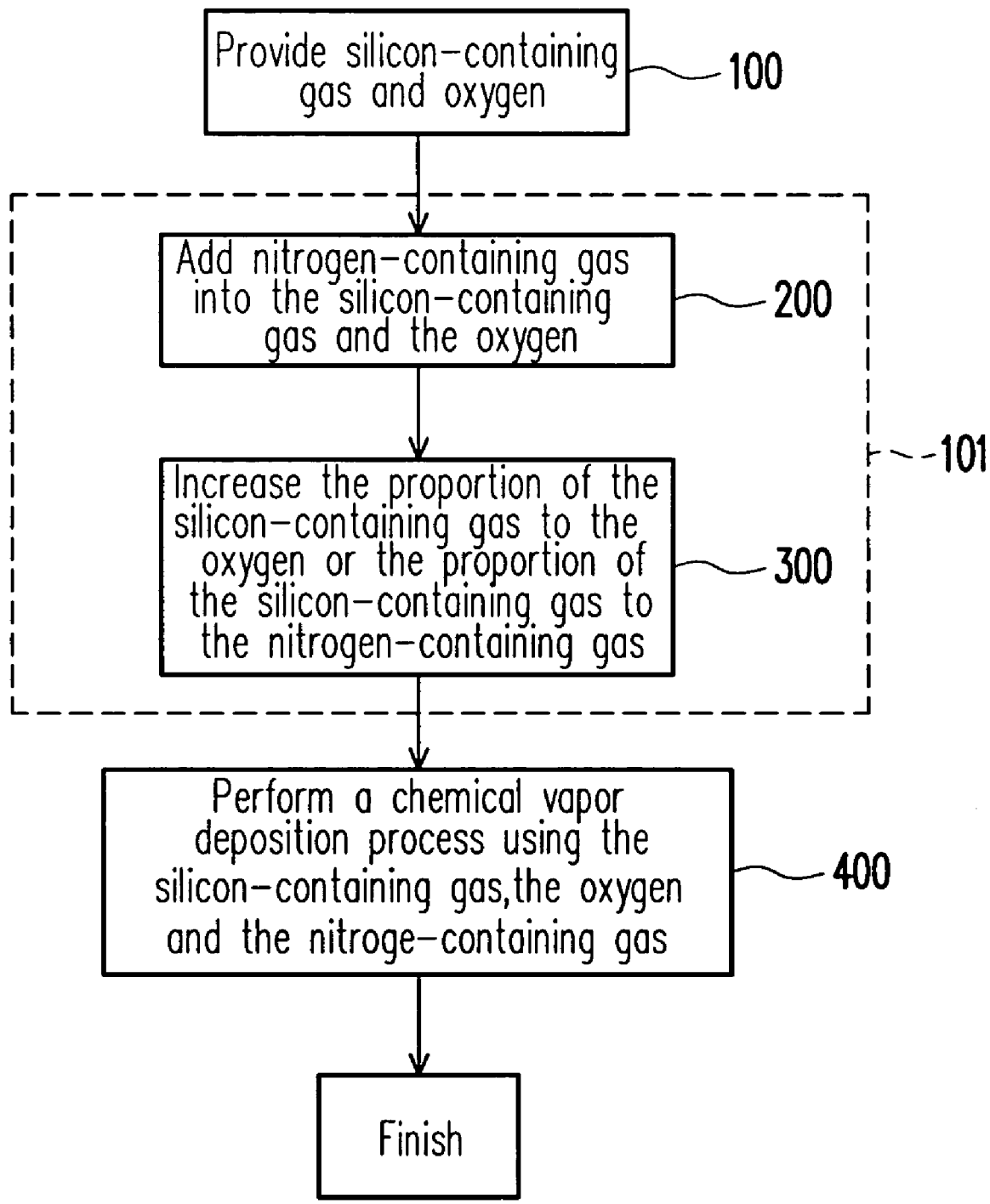
FIG. 1 is a flow chart showing the steps for manufacturing a dielectric anti-reflective coating according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

In the prior art, however forming the silicon dioxide layer by reacting silane with oxygen or forming the silicon oxynitride layer by reacting silane with nitrous oxide or ammonia, it is impossible to control n value and k value of the silicon dioxide layer and the silicon oxynitride layer so that this type of anti-reflective coating does not have minimal substrate reflectivity. In the following, a method for manufacturing the anti-reflective coating capable of getting the predetermined n value and the predetermined k value is described to illustrate the characteristics of the present invention. However, the embodiment should by no means limit the scope of the present invention.

FIG. 1 is a flow chart showing the steps for manufacturing a dielectric anti-reflective coating according to one preferred embodiment of the present invention. As shown in FIG. 1, silicon-containing gas and oxygen ($O_2$) are provided in step 100. The aforementioned gases are used as the reactive gases in a chemical vapor deposition process to form a dielectric anti-reflective coating (DARC). The silicon-containing gas is silane ($SiH_4$), for example.

To control the properties of the dielectric anti-reflective coating, the n value and the k value, a two-step process 101 comprising a first step 200 and a second step 300 is carried out. In step 200, nitrogen-containing gas is added to the silicon-containing gas and the oxygen to control the n value of the DARC, wherein the gas flow ratio of the nitrogen-containing gas to the silicon-containing gas and the oxygen_is about 0.01~10 for controlling the n value of the DARC, for example. The nitrogen-containing gas is nitrous oxide ($N_2O$), ammonia ($NH_3$) or other suitable gases. Thereafter, in step 300, the proportion of the silicon-containing gas to the oxygen or the proportion of the silicon-containing gas to the nitrogen-containing gas is increased to control the k value of the DARC. In the present embodiment, the DARC is a silicon oxynitride layer having a silicon content higher than that formed by reacting silane ($SiH_4$) with nitrous oxide ($N_2O$) or ammonia ($NH_3$).

Assume the DARC needs to have an n value of 1.7 and a k value of 0.6, the gas flow ratio between the silane and the oxygen is about 1~1.5 and the gas flow rate of the nitrogen-containing gas (nitrous oxide or ammonia) is about 75~300 sccm, for example.

In another embodiment, assume the DARC still needs to have an n value of 1.7 and a k value of 0.6, the gas flow ratio between the silane and the nitrogen-containing gas (nitrous oxide or ammonia) is about 1~1.5 and the gas flow rate of the nitrogen-containing gas is about 95 sccm.

Finally, in step 400, a chemical vapor deposition process is performed using silicon-containing gas, oxygen and nitrogen-containing gas having the aforementioned gas flow rates and proportions to form the DARC with the predetermined n value and k value.

In summary, the aspects of the present invention includes:

1. By adding nitrogen-containing gas into the reactive gases for forming the DARC, the DARC can have a precise n value.

2. By increasing the proportion of silicon-containing gas to the oxygen or the proportion of the silicon-containing gas to the nitrogen-containing gas, the DARC can have a precise k value.

3. Because photolithographic process is one of the most critical processes in semiconductor fabrication, proper control of the n value and k value of the DARC can reduce the difference in reflectivity from the surface of a DARC coated device pattern located at different height levels. Hence, pattern can be accurately transferred in a photolithographic process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for controlling the properties of a dielectric anti-reflective coating (DARC) in a process of fabricating the DARC using a silicon-containing gas and oxygen as the reactive gases, the feature of the method comprising:

adding a nitrogen-containing gas into the silicon-containing gas and the oxygen when forming the DARC, wherein the gas flow ratio of the nitrogen-containing gas to the silicon-containing gas and the oxygen—is about 0.01~10 for controlling the n value of the DARC, and increasing the proportion of the silicon-containing gas to the oxygen or the proportion of the silicon-containing gas to the nitrogen-containing gas to control the k value of the DARC, wherein the gas flow ratio between the silicon-containing gas and the oxygen is about 1~1.5 when the dielectric anti-reflective coating has an n value of about 1.7 and a k value of about 0.6.

2. The method of claim 1, wherein the dielectric anti-reflective coating comprises a silicon oxynitride layer.

3. The method of claim 2, wherein the silicon-containing gas comprises silane.

4. The method of claim 3, wherein the nitrogen-containing gas comprises nitrous oxide or ammonia.

5. The method of claim 1, wherein the gas flow rate of the nitrogen-containing gas is between about 75~300 sccm.

6. The method of claim 1, wherein the gas flow rate of the nitrogen-containing gas is about 95 sccm.

7. The method of claim 1, wherein the gas flow ratio between the silicon-containing gas and the nitrogen-containing gas is about 1~1.5 when the k value of the dielectric anti-reflection coating is about 0.6.

8. A method for manufacturing a dielectric anti-reflective coating (DARC) having a predetermined n value and a predetermined k value, comprising the steps of:

providing silicon-containing gas and oxygen, wherein the gas flow ratio between the silicon-containing gas and the oxygen is about 1~1.5 when the dielectric anti-reflective coating has an n value of about 1.7 and a k value of about 0.6;

adding nitrogen-containing gas into the silicon-containing gas and the oxygen, wherein the gas flow ratio of the nitrogen-containing gas to the silicon-containing gas and the oxygen—is about 0.01~10 for getting the predetermined n value of the DARC, increasing the proportion of the silicon-containing gas to the oxygen or the proportion of the silicon-containing gas to the nitrogen-containing gas to form the DARC with the predetermined k value; and performing a chemical vapor deposition process using the silicon-containing gas, the oxygen and the nitrogen-containing gas mixed in the aforementioned proportion.

9. The method of claim 8, wherein the dielectric anti-reflective coating comprises a silicon oxynitride layer.

10. The method of claim 9, wherein the silicon-containing gas comprises silane.

11. The method of claim 10, wherein the nitrogen-containing gas comprises nitrous oxide or ammonia.

12. The method of claim 8, wherein the gas flow rate of the nitrogen-containing gas is between about 75~300 sccm.

13. The method of claim 12, wherein the gas flow rate of the nitrogen-containing gas is about 95 sccm.

14. The method of claim 8, wherein the gas flow ratio between the silicon-containing gas and the nitrogen-containing gas is about 1~1.5 when the k value of the dielectric anti-reflection coating is about 0.6.

* * * * *